United States Patent [19]

Rogers

[11] Patent Number: 5,426,380
[45] Date of Patent: Jun. 20, 1995

[54] HIGH SPEED PROCESSING FLIP-FLOP

[75] Inventor: Alan C. Rogers, Palo Alto, Calif.

[73] Assignee: Sun Microsystems, Inc., Mountain View, Calif.

[21] Appl. No.: 316,545

[22] Filed: Sep. 30, 1994

[51] Int. Cl.[6] .......................................... H03K 19/173
[52] U.S. Cl. ....................................... 326/46; 327/211; 327/212
[58] Field of Search ................... 326/46, 83; 327/299, 327/203, 210, 211, 212, 408; 377/76

[56] References Cited

U.S. PATENT DOCUMENTS

| | | | |
|---|---|---|---|
| 5,023,484 | 6/1991 | Pathak et al. | 326/46 |
| 5,028,814 | 7/1991 | Sung et al. | 327/203 |
| 5,164,612 | 11/1992 | Kaplinsky | 327/408 |
| 5,295,174 | 3/1994 | Shimizu | 377/76 |

Primary Examiner—David R. Hudspeth
Assistant Examiner—Richard Roseen
Attorney, Agent, or Firm—Blakely Sokoloff Taylor & Zafman

[57] ABSTRACT

A high speed processing flip-flop contains a header circuit and a pulse flip-flop circuit. The header circuit is a clock pre-processing circuit that generates clock pulses for operation of the pulse flip-flop circuit, and the pulse flip-flop circuit is a single stage latch. The header circuit contains functional logic including the flip-flop functionality for the high speed processing flip-flop, and any additional processing functions, such as multiplexing. The header circuit also contains a pulse modulator that generates selected clock pulses, based on the functional logic, for the pulse flip-flop circuit. The pulse flip-flop circuit contains storage, a driver circuit, and, for each data input, an input buffer, and a pass gate. The pulse flip-flop circuit couples the data to the driver circuit and storage during an active clock pulse for the corresponding data. Consequently, data input to the pulse flip-flop is not delayed by logic processing.

16 Claims, 6 Drawing Sheets

HIGH SPEED PROCESSING FLIP-FLOP

FIELD OF THE INVENTION

The present invention relates to the field of flip-flop circuits, and more particularly, to a high speed processing flip-flop.

BACKGROUND OF THE INVENTION

There are a number of applications for synchronous operation of digital circuits. Synchronous designs in digital circuits are often implemented with master/slave flip-flops. The master/slave flip-flops are utilized as the synchronizing elements. In one application for synchronous designs in digital circuits, the master/slave flip-flops delay transitions in the state of the circuit until a synchronizing signal, such as a clock signal, arrives. The master/slave flip-flops exhibit a speed overhead that is indicated by the set-up time and the clock-q time (e.g. the propogation delay) of a latching device or register in the master/slave flip-flop. However, the total delay of the register is significantly greater than the sum of the set-up time and the clock-q time of the register.

In order to illustrate the total delay of a register, an example of a 50 megahertz (MHz) system that utilizes a master/slave flip-flop with a specification having a set-up time of 270 picoseconds (ps) and a clock-q time of 430 ps is provided. A total delay time of 700 ps of the 20 nanosecond (ns) cycle time is derived by adding the set-up time and the clock-q time of the register. However, allocating only 270 ps of set-up time for the latching function results in a clock-q time much slower than the 430 ps specification. The optimal speed performance of the register would require in the order of 330 ps for set-up and 570 ps for clock-q. Based on the 330 ps set-up and 570 ps clock-q specifications, 900 ps of the 20 ns cycle time is required.

In addition to providing fast operation for the latching function, it is desirable to integrate additional processing within the flip-flop. For example, implementing a data-path scan multiplexer function within the flip-flop provides utility for testing the circuit. For the system example described above, a total of 19.3 ns remains for execution of a logical operation in the master/slave flip-flop. However, a data-path scan multiplexer may add 250 ps to the set-up time and utilization of a simple multiplexer results in an even greater time requirement. Therefore, it is desirable to integrate functions within a flip-flop without decreasing the speed of the device.

SUMMARY OF THE INVENTION

A high speed processing flip-flop contains a header circuit and a pulse flip-flop circuit. The header circuit is a clock pre-processing circuit that generates clock pulses for operation of the pulse flip-flop circuit. The header circuit receives a clock signal for operation of the high speed processing flip-flop circuit. In general, the pulse flip-flop circuit is a single stage latch. The pulse flip-flop circuit receives data for operation of the high .speed processing flip-flop circuit.

The header circuit further includes functional logic and a pulse modulator. The functional logic is configured to include the flip-flop functionality for the high speed processing flip-flop. In addiction, functional logic may implement additional processing functions, such its multiplexing. The functional logic receives both a functional input and the clock input, and generates an enable signal in accordance with the function. The pulse modulator receives the enable signal, and generates selective clock pulses accordingly. The pulse modulator includes a mock flip-flop circuit to control the selected clock pulses. The pulse generation utilizing the mock flip-flop circuit matches process and operating conditions in the pulse flip-flop circuit.

In addition, the pulse flip-flop circuit receives a clock pulse from the header circuit for each data input that is generated. The pulse flip-flop circuit contains storage, a driver circuit, and, for each data input, an input buffer, and a pass gate. The pulse flip-flop circuit couples the data to the driver circuit and storage during an active clock pulse for the corresponding data. Consequently, data input to the pulse flip-flop is not delayed by logic processing.

Other objects, features and advantages of the present invention will be apparent from the accompanying drawings, and from the detailed description that follows below.

BRIEF DESCRIPTION OF THE DRAWINGS

The objects, features, and advantages of the present invention will be apparent from the following detailed description of the preferred embodiment of the invention with references to the following drawings.

DETAILED DESCRIPTION

Figure 1:
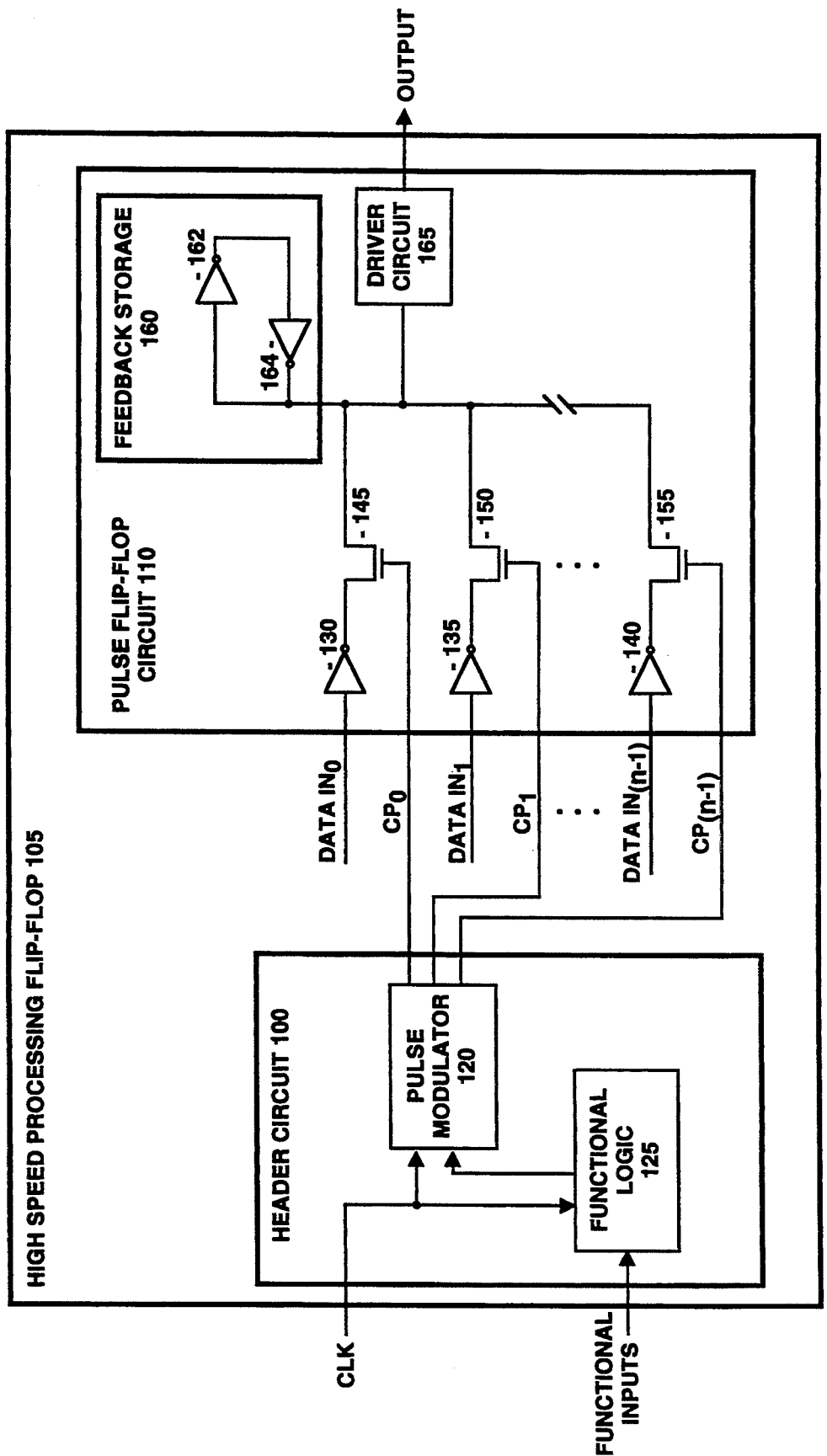
FIG. 1 illustrates one embodiment for a high speed processing flip-flop configured in accordance with the present invention.

FIG. 1 illustrates one embodiment for a high speed processing flip-flop configured in accordance with the present invention. As is explained fully below, the high speed processing flip-flop circuit of the present invention implements flip-flop logic and/or multiplexing logic in a pre-processing clock circuit (e.g. separate from the data path). Because the pre-processing circuit performs much of the functionality, a data path circuit includes only a single stage latch driven by a pulsed clock. Consequently, increased speeds for the flip-flop devices are achieved.

A high speed processing flip-flop 105 includes a header circuit 100 and a pulse flip-flop circuit 110 as shown in FIG. 1. The header circuit 100 is one implementation for the pre-processing clock circuit, and the pulse flip-flop circuit 110 is one implementation for the data path circuit. The header circuit 100 contains a pulse modulator circuit 120 and functional logic 125. In general, the header circuit 100 receives, as inputs, a dock signal (CLK) and functional logic inputs. The CLK signal generates a timing reference, such as a clock signal utilized in conventional prior art flip-flop circuits. The header circuit 100 generates, as outputs, short clock pulses for operation of the pulse flip-flop circuit 110.

The functional logic 125 includes circuitry for implementing a function, such as data multiplexing, data/scan multiplexing, and flip-flop functionality, such as functionality for a master/slave flip-flop. The functional logic 125 may include any function. The functional inputs are inputs utilized in the flip-flop logic and/or multiplexing logic implemented in the functional logic 125. The functional logic 125 outputs an enable signal to the pulse modulator 120 to generate certain clock pulses for the pulse flip-flop circuit 110. As is explained more fully below, the pulse modulator 120 includes a "mock" flip-flop circuit, emulating the circuitry contained in the pulse flip-flop circuit 110. The "mock" flip-flop circuit results in generation of accurate clock pulses for use in the pulse flip-flop circuit 110.

In a preferred embodiment, the pulse flip-flop circuit 110 contains a single stage latch. The single stage latch implementation results in a short data path (e.g. the data is propagated through only a few transistors). Consequently, the propagation delay time is short in the pulse flip-flop circuit 110. The pulse flip-flop circuit 110 illustrated in FIG. 1 receives "n" data inputs (Data $In_0$-Data $In_{(n-1)}$). The "n" data inputs represent the data inputs for the multiplexing function, such that selected data inputs, selected based on the functional inputs, are propagated through the pulse flip-flop circuit 110. In addition to receiving the data inputs, the pulse flip-flop circuit 110 receives the clock pulse signals ($CP_0$-$CP_{(n-1)}$) from the header circuit 100. The clock pulse signals ($CP_0$-$CP_{(n-1)}$) determine which of the data inputs (Data $In_0$-Data $In_{(n-1)}$) are selected.

The pulse flip-flop circuit 110 includes inverters 130, 135, and 140, and pass gates 145, 150 and 155. The pulse flip-flop circuit 110 further includes feedback storage 160, implemented with inverters 162 and 164, and a driver circuit 165. The driver circuit 165 buffers the output for the pulse flip-flop circuit 110. In operation, the header circuit 100 generates the appropriate clock pulses to drive the pulse flip-flop circuit 110. Data inputs are received at the pulse flip-flop circuit 110, and buffered in the corresponding inverter (130, 135, and 140). When the selected clock pulse goes active, the pass transistors (145, 150, and 155) are biased to couple the output of the inverter to the feedback storage 160 and driver circuit 165. The feedback storage 160 retains the state of the pulse flip-flop circuit 110, and the driver circuit 165 provides the appropriate output drive for the pulse flip-flop circuit 110.

The generation of pulses, instead of receiving clock edges, in the high speed processing flip-flop of the present invention effectively moves flip-flop functionality from the data path to the header circuit 100. Therefore, the data path for the data input to the pulse flip-flop circuit 110 only propagates through the inverter (130, 135 or 140), the pass gate (145, 150, or 155), and the driver circuit 165. In addition, the single stage latch in the pulse flip-flop 110 is implemented with only one NMOS transistor (e.g. pass gate). As described above, data are passed through the pulse flip-flop circuit 110 during a short pulse generated by the header circuit 100. The short pulse may be generated from either a rising edge or a falling edge of the clock input to the header circuit 100. Consequently, the pulse flip-flop circuit 110 is a fast pulse flip-flop circuit containing the fewest gates possible.

Figure 2:
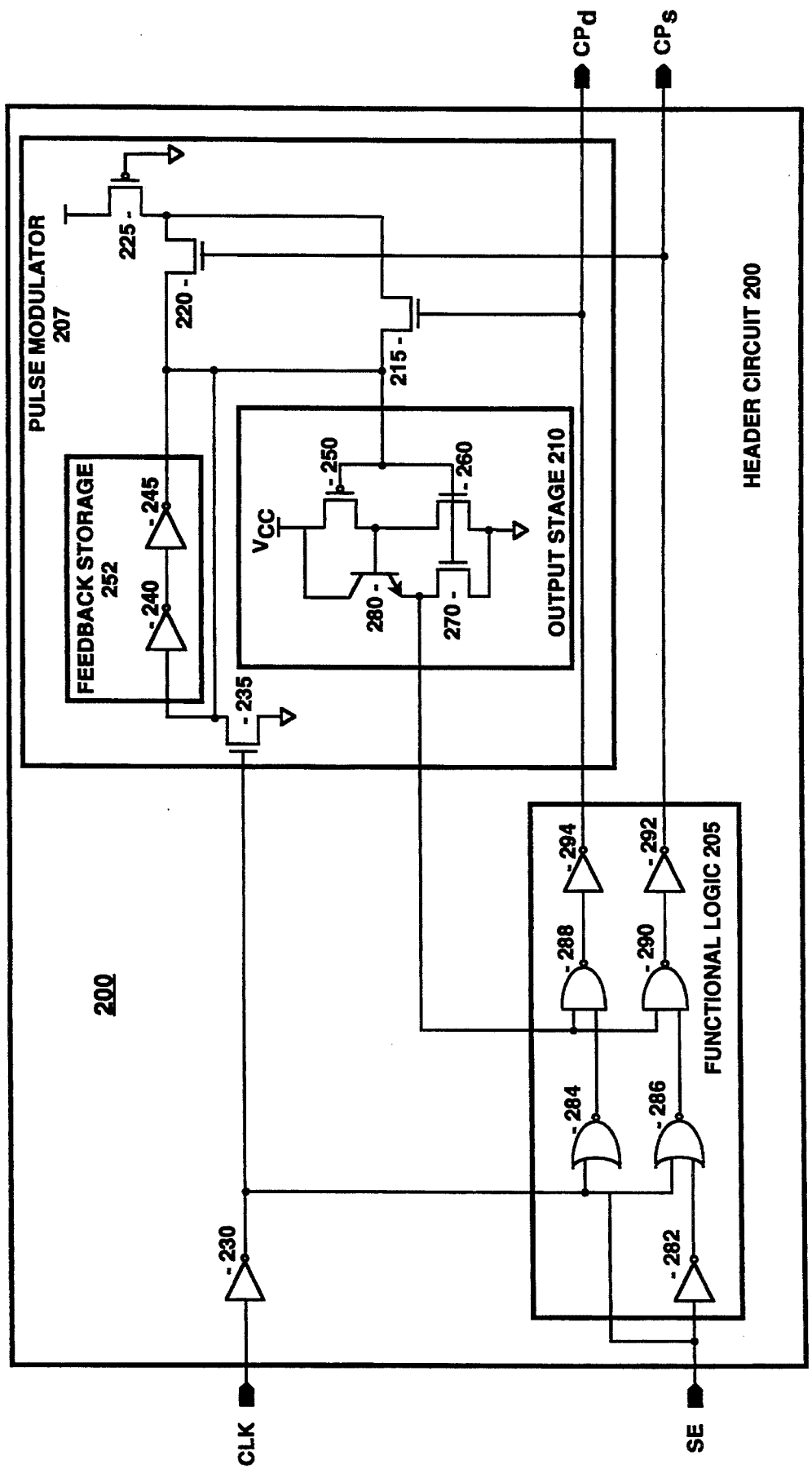
FIG. 2 illustrates one embodiment for a header circuit configured in accordance with the present invention.

FIG. 2 illustrates one embodiment for a header circuit configured in accordance with the present invention. For a header circuit 200 illustrated in FIG. 2 master/slave flip-flop and scan/data multiplexing functions are implemented. The header circuit 200 receives, as inputs, a clock signal (CLK) and a scan enable signal (SE), and generates, as outputs, a data clock pulse ($CP_d$) and a scan clock pulse ($CP_s$). In order to implement the multiplexing function, the header circuit 200 generates a data clock pulse when the scan enable signal is inactive, and generates a scan clock pulse when the scan enable is active. For the header circuit 200, a high scan enable generates the clock pulse scan ($CP_s$) and a low scan enable activates the clock pulse data ($CP_d$).

In order to generate the appropriate clock pulse data ($CP_d$) and clock pulse scan ($CP_s$) signals, the header circuit 200 contains functional logic 205, output stage 210, pass gates 215 and 220, and a pull-up gate 225. In addition, the header circuit 200 includes an inverter 230, a pull-down transistor 235, and a feedback storage circuit 252. The feedback storage circuit 252 contains inverters 240 and 245. The output of inverter 245 is coupled to the pull-up gate 225 via the pass gates 215 and 220. The clock pulse data ($CP_d$) line is coupled to the gate of pass transistor 215, and the clock pulse scan line ($CP_s$) is coupled to the pass transistor 220. The output stage 210 couples the output of inverter 245 and an input to the functional logic 205. As shown in FIG. 2, the output stage 210 contains a complementary metal oxide semiconductor (CMOS) inverter including transistors 250 and 260, and a Bi-NMOS inverter including NPN transistor 280 and NMOS transistor 270.

For the header circuit 200, functional logic 205 contains inverters 282, 292, 294, NOR gates 284 and 286, and NAND gates 288 and 290. The functional logic 205 implements a scan/data multiplexing function and a master/slave flip-flop function. Specifically, for the scan/data multiplexing function, the functional logic 205 generates an active clock pulse scan ($CP_s$) signal when the scan enable is a high logic level and generates an active clock pulse data ($CP_d$) signal when the scan enable is a low logic level. The logic required to implement a flip-flop function, such as a master/slave flip-flop, is well known in the art.

In operation, the functional logic 205 receives the clock edge, inverted from inverter 230, the scan enable signal, and the state of the feedback storage 252 via the output stage 210. The functional logic 205 generates a high voltage level at either the clock pulse data line or clock pulse scan line depending upon the state of the scan enable input and the state of the feedback storage 252. In general, the clock signal (CLK) transition causes either the clock pulse data line or clock pulse scan line to receive an increasing voltage to generate an active clock pulse. The feedback from the output stage 210 into the functional logic 205 terminates the active clock pulse.

Prior to generating an active clock pulse, the output of inverter 230 is a high logic level and the scan enable is a low logic level, such that the output of NOR gate 284 is a low logic level. If the output of the output stage 210 is a low logic level, then a low logic level is generated at the clock pulse data line. If the output of inverter 230 is a high logic level and the scan enable is a low logic level, then the output of NOR gate 286 is a low logic level. If the output of the output stage 210 is a low logic level, then a low logic level is generated at the clock pulse scan line.

When the clock input (CLK) transitions from a low logic level to a high logic level, inverter 230 outputs a low logic level into NOR gates 284 and 286. If the scan enable is not selected, the output of NOR gate 284 is a low logic level thereby generating a high logic level at the output of NOR gate 284. If the output of the output stage 210 is a high logic level, then a high logic level is generated at the clock pulse data line. If the scan enable is selected, the output of NOR gate 286 is a low logic level thereby generating a high logic level at the output of NOR gate 286. If the output of the output stage 210 is a high logic level, then a high logic level is generated at the clock pulse scan line.

As the voltage increases on the clock pulse data or clock pulse scan lines, the respective pass gate (215 or 220) is biased to begin conducting current. As the pass gate 215 or 220 begins to conduct current, the output stage 210 generates a voltage representing a low logic level. The low logic level voltage is input to the NAND gate 288 and NAND gate 290, and the output of NAND gates 288 and 290 are input to inverters 294 and 292, respectively. Consequently, a low logic level is generated at the respective clock pulse data line or clock pulse scan line. The low logic level at the clock pulse data or clock pulse scan lines biases the pass gates 215 or 220 to conduct no current, thereby terminating the active clock pulse. Consequently, the clock pulse data or clock pulse scan retains a high logic level voltage only long enough to pass voltage through the pass gate 215 or 220, NAND gate 288 or 290, inverter 294 or 292, and output stage 210.

In a preferred embodiment, the header circuit 100 includes a mock pulse flip-flop circuit for generation of the clock pulses. The mock flip-flop circuit includes the feedback storage 252 and the output stage 210. The feedback storage 252 and the output stage 210 resemble the feedback storage 160 and driver circuit 165 of pulse flip-flop circuit 110 illustrated in FIG. 1. Because the pulses are generated from the mock pulse flip-flop circuit (i.e. resembling the pulse flip-flop circuit 110), the header circuit 100 provides absolute process, load and operating conditions for generating the clock pulses. In the prior art circuit, using a self-timed gate delay to generate pulses is load and data dependent.

The header circuit 200 is a clock pre-processing circuit in that only the clock and functional inputs are input to the header circuit 200 (e.g. data are input to the pulse flip-flop only). The propagation delay through the header circuit 100 is overhead because no penalty occurs for the propagation delay as long as all clock signals input to header circuits exhibit the same delay. By moving the gates and subsequent delay from the pulse flip-flop circuit to the header circuit, fast propagation of the data path is achieved.

Figure 3:
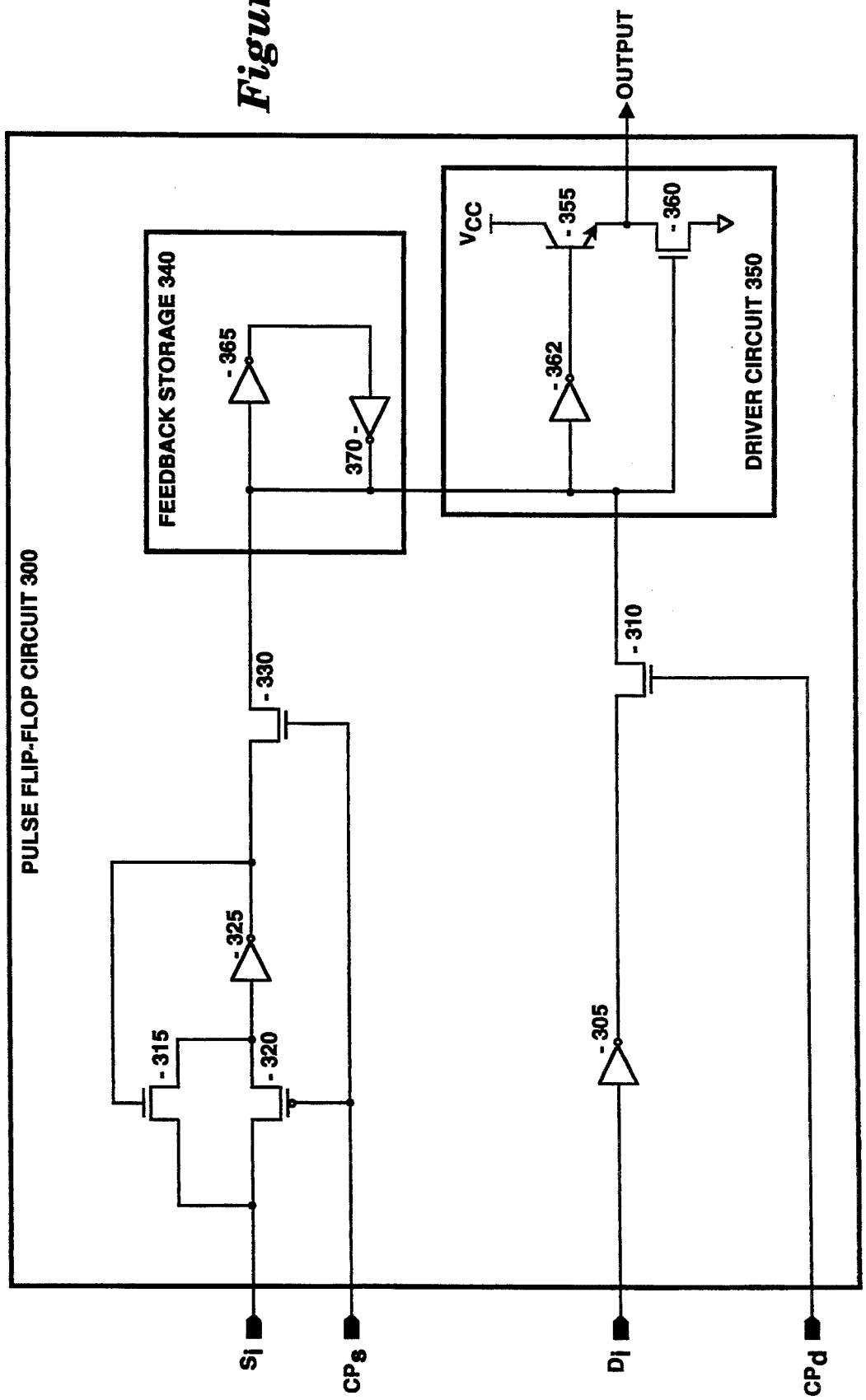
FIG. 3 illustrates a flip-flop circuit configured in accordance with one embodiment of the present invention.

FIG. 3 illustrates a flip-flop circuit configured in accordance with one embodiment of the present invention. A flip-flop circuit 300 shown in FIG. 3 operates in conjunction with the header circuit 200 illustrated in FIG. 2. The flip-flop circuit 300 receives, as inputs, the clock pulse data ($CP_d$) and the clock pulse scan ($CP_s$) from the header circuit 200. In addition, the flip-flop circuit 300 receives a scan input ($S_i$) and a data input ($D_i$). The scan input ($S_i$) and the data input ($D_i$) are the initial starting point for the data path in the high speed processing flip-flop of the present invention. In general, the pulse flip-flop circuit 300 generates an output in accordance with the clock pulse data ($CP_d$) and the clock pulse scan ($CP_s$) signals generated in the header circuit 200.

The pulse flip-flop circuit 300 contains a feedback storage 340 and a driver circuit 350. In addition, the pulse flip-flop circuit 300 includes a latching gate 310 for the data input ($D_i$) path and a latching gate 330 for the scan input ($S_i$) path. The latching gates 310 and 330 couple the data input and scan inputs to the feedback storage 340 and driver 350. The feedback storage 340 includes inverters 365 and 370. The driver 350 contains an inverter 362, a bipolar NPN transistor 355, and a NMOS transistor 360 coupled to form a Bi-NMOS inverter. In addition to the latching gate 310, the data input ($D_i$) path includes an inverter 305. The scan input contains NMOS transistor 315, PMOS transistor 320 and inverter 325 to permit reading and writing data to and from the feedback storage 340.

In operation, if an active clock pulse scan ($CP_s$) is generated, then the latching gate 330 couples the scan input ($S_i$) path to the feedback storage 340 and the driver circuit 350. For a scan operation, datum is input at the scan input ($S_i$) and passed to the feedback storage 340 during the active clock pulse scan ($CP_s$). If an active clock pulse data ($CP_d$) is generated, then the latching gate 310 couples the date input ($D_i$) path to the feedback storage 340 and the driver circuit 350. Consequently, the functional logic, for generating the output for the master/slave flip-flop function and the multiplexing function is implemented in the functional logic 205 contained in the leader circuit 200. As shown in FIG. 3, the data path for the flip-flop circuit 300 consists only of inverter 305, latching gate 310, and driver circuit 350. Consequently, a short data path is provided, and the propagation delay of the high speed processing flip-flop is reduced.

Figure 4:
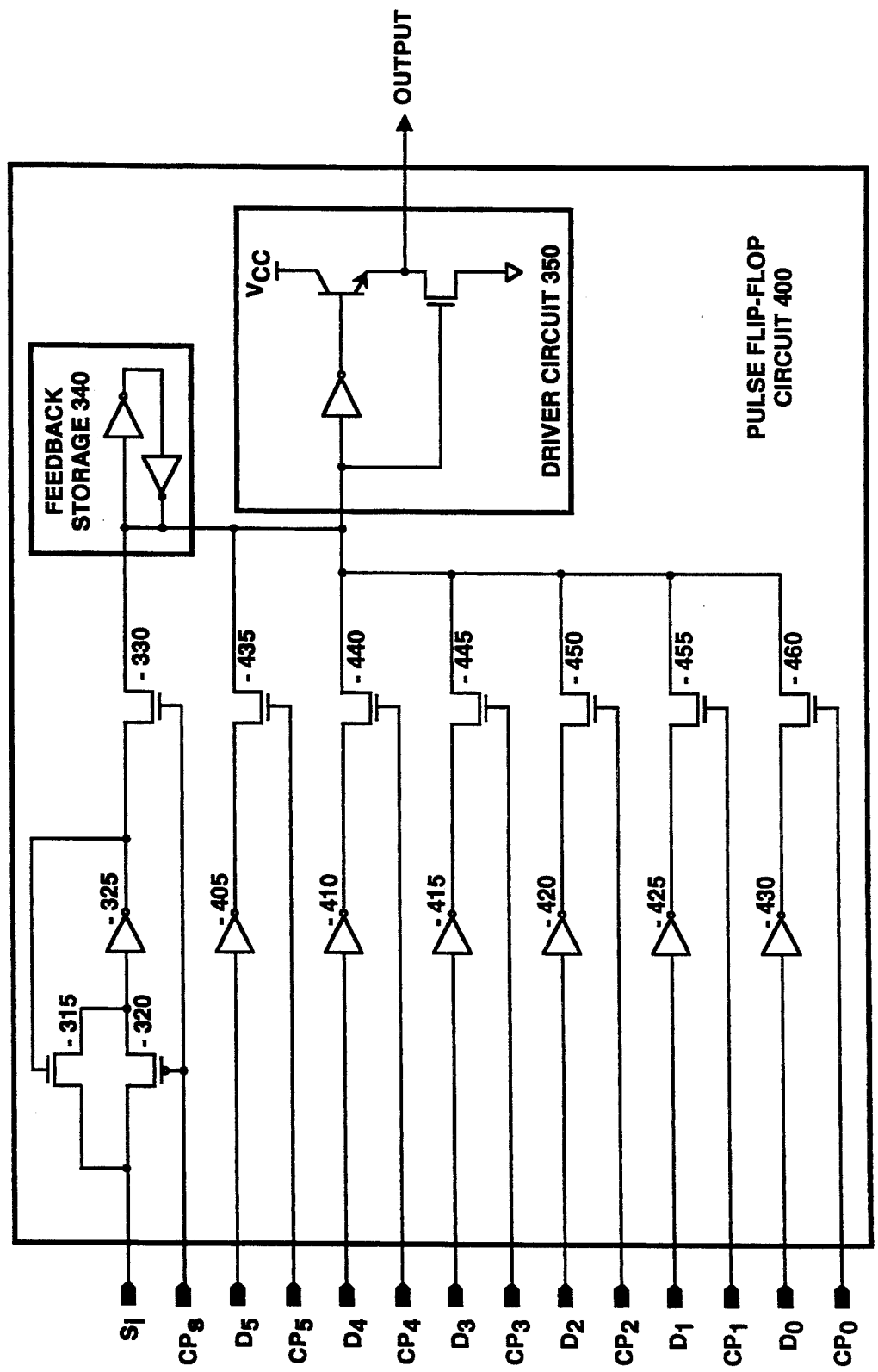
FIG. 4 illustrates a second embodiment for a flip-flop circuit configured in accordance with the present invention.

FIG. 4 illustrates a second embodiment for a flip-flop circuit configured in accordance with the present invention. A flip-flop circuit 400 includes the function of multiplexing six data lines and one scan line into a single output. As described above, the multiplexing function for the high speed processing flip-flop of the present invention is implemented in a header circuit, similar to the multiplexing of the scan and data inputs illustrated in the header circuit 200 of FIG. 2. The pulse flip-flop circuit 400 contains the driver circuit 350 and the feedback storage 340. In addition, each data input ($D_0$–$D_5$) contains an inverter (430, 425, 420, 415, 410, and 405), and a latching gate (460, 455, 450, 445, 440, and 435). The scan input ($S_i$) includes pass transistors 315 and 320, inverter 325, and latching gate 330.

In operation, the pulse flip-flop circuit 400 receives, as inputs, an active clock pulse (e.g. $CP_0$, $CP_1$, $CP_2$, $CP_3$, $CP_4$, $CP_5$ and $CP_6$) from the header circuit to indicate the selected input line for the pulse flip-flop circuit 400. In response, the respective latching gate (460, 455, 450, 445, 440, and 435) couples the selected input line to the feedback storage 340 and driver circuit 350. Although FIG. 4 illustrates multiplexing of six data lines and one scan line, any number of inputs, data or otherwise, may be implemented in the header and flip-flop circuits of the present invention without deviating from the spirit and scope of the present invention.

Figure 5:
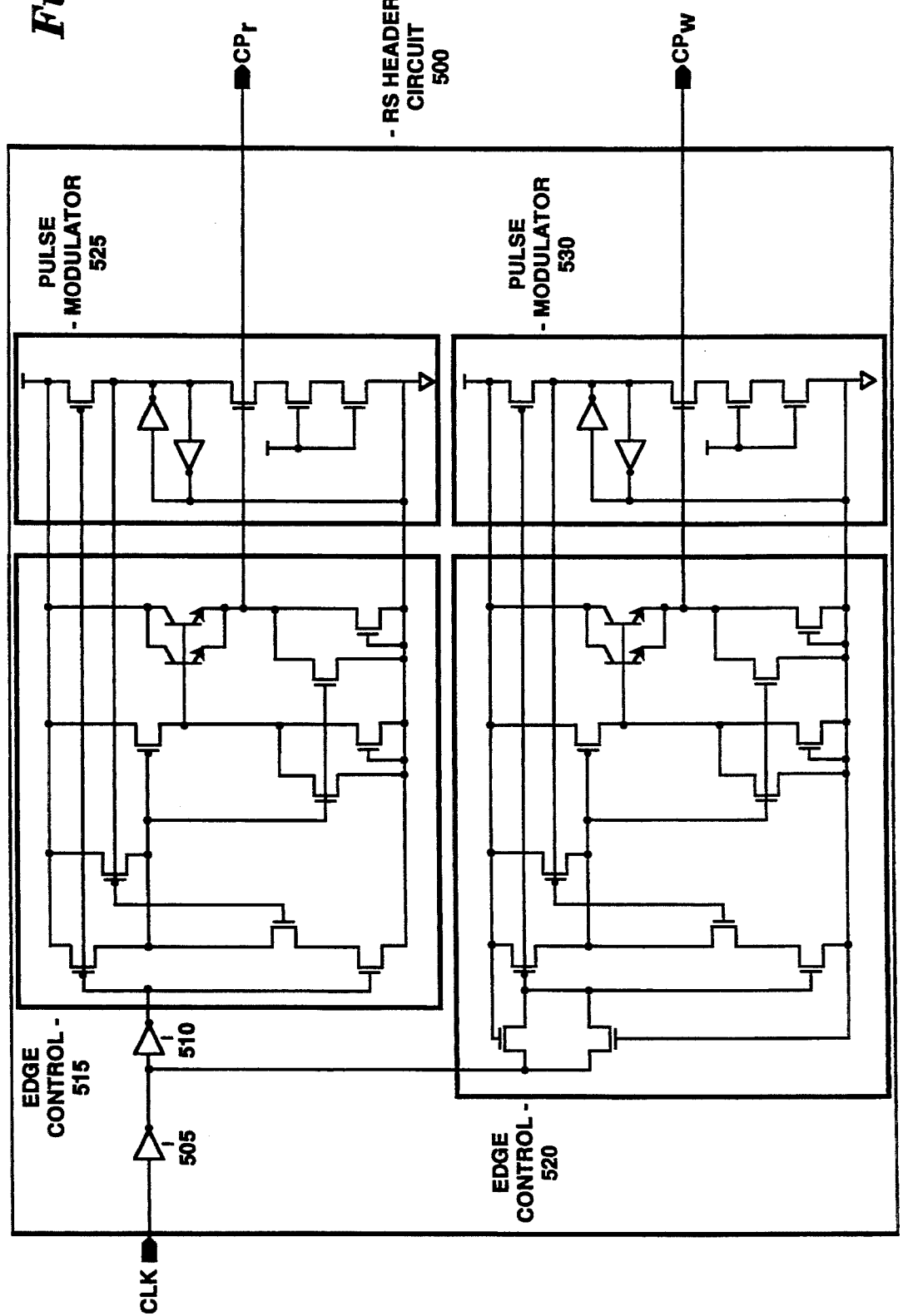
FIG. 5 illustrates a header circuit for operation in conjunction with a read/write multiplexed RS pulse flip-flop circuit configured in accordance with one embodiment of the present invention.

FIG. 5 illustrates a header circuit for operation in conjunction with a read/write multiplexed RS pulse flip-flop circuit configured in accordance with one embodiment of the present invention. In general, a header circuit 500 receives, as an input, a clock signal (CLK), and generates, as outputs, a clock pulse red (CP$_r$) and a clock pulse white (CP$_w$). For the embodiment illustrated in FIG. 5, the header circuit 500 includes a multiplexing function such that the header circuit 500 generates an active clock pulse red (CP$_r$) on the rising edge of the clock signal (CLK), and an active clock pulse white (CP$_w$) on the falling edge of the clock signal (CLK). In order to generate the clock pulse red (CP$_r$), the header circuit 500 contains edge control 515 and pulse modulator 525. The header circuit 500 also contains edge control 520 and pulse modulator 530 to generate the clock pulse white (CP$_w$). The header circuit 500 further includes inverters 505 and 510.

Figure 6:
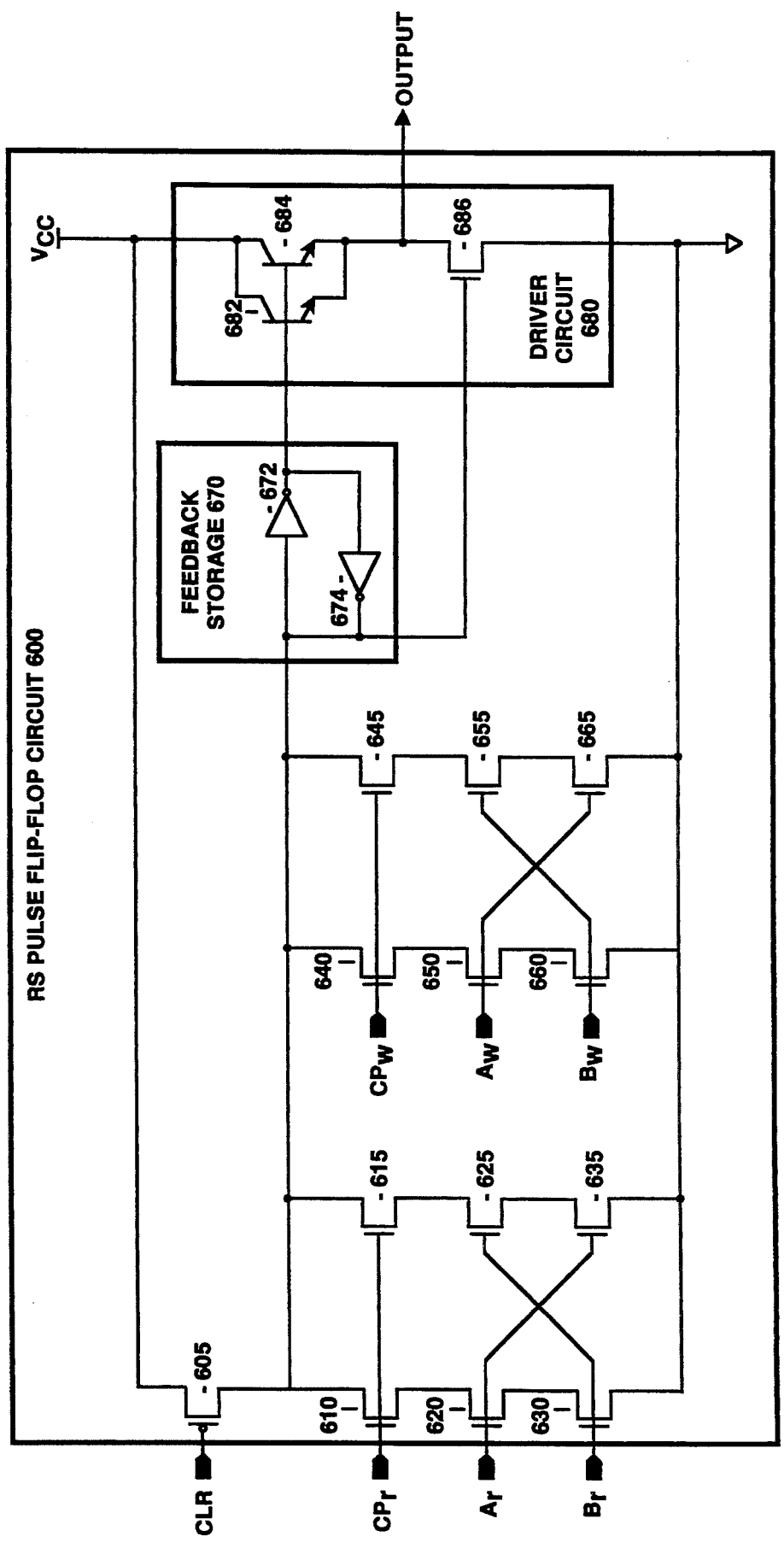
FIG. 6 illustrates a RS pulse flip-flop circuit configured in accordance with one embodiment of the present invention.

In operation, the clock signal (CLK) is input to inverter 505. In turn, the inverter 505 inputs the inverted signal to the edge control 520 and inverter 510. The inverter 510 inverts the signal for input to the edge control 515. Therefore, the inverters 505 and 510 operate as a clock phase splitter to provide a multiplexing function for a RS flip-flop circuit (FIG. 6). As shown in FIG. 5, the edge control 515 and inverter 510 exhibit an equivalent input delay as the edge control 520. In general, the edge controls 515 and 520 implement a logical NOR operation to provide the RS flip-flop functionality. In addition, the edge controls 515 and 520 contain an output stage analogous to the output stage 210 shown in FIG. 2. The pulse modulators 525 and 530 also contain identical circuitry. The pulse modulators 525 and 530 provide the "target" flip-flops including the feedback storage.

FIG. 6 illustrates a RS pulse flip-flop circuit configured in accordance with one embodiment of the present invention. A RS pulse flip-flop circuit 600 operates in conjunction with the header circuit 500 illustrated in FIG. 5. The RS pulse flip-flop circuit 600 receives, as inputs, a clock pulse W (CP$_w$) and a clock pulse R (CP$_r$) from the header circuit 503. In addition, the RS pulse flip-flop circuit 600 receives a clear signal (CLR), and a plurality of data input signals (S$_r$, S$_w$, R$_r$, and R$_w$). Furthermore, the RS pulse flip-flop 600 contains NMOS pass transistors 610 and 615 for the clock pulse R (CP$_r$) signal, and NMOS pass transistors 640 and 645 for the clock pulse W (CP$_w$) signal.

The RS pulse flip-flop 600 further includes a first AND function, implemented with cross-coupled NMOS transistors 620, 625, 630 and 635 for operation in conjunction with input data signals S$_r$ and R$_r$, and a second AND function, implemented with cross-coupled NMOS transistors 650, 655, 660, and 665 for operation in conjunction with input data S$_w$ and R$_w$ signals. The RS pulse flip-flop 600 also includes a feedback storage 670, implemented with inverters 672 and 674, and a driver circuit 680. The driver circuit 680 contains bipolar NPN transistors 682 and 684 and NMOS transistor 686.

In operation, the header circuit 500 generates the clock pulse R (CP$_r$) and clock pulse W (CP$_w$) in order to implement the multiplexing function for the RS pulse flip-flop circuit 600. When the clock pulse R (CP$_r$) is active, NMOS transistors 610 and 615 couple the cross-coupled transistors 620, 625, 630 and 635 to the feedback storage 670 and the driver circuit 680. Alternatively, when the clock pulse W (CP$_w$) is active, NMOS transistors 640 and 645 couple the cross-coupled transistors 650, 655, 660 and 665 to the feedback storage 670 and the driver circuit 680. The set state is reached in the RS pulse flip-flop circuit 600 when S$_r$ is driven to a high logic level, and R$_r$ is driven to a high logic level. In order to change the state to a clear, the CLR signal is set to an active low. The operation of the S$_w$, R$_w$ and CP$_w$ signals in the RS pulse flip-flop circuit 600 is analogous to the operation of the CP$_r$, S$_r$, and R$_r$ signals.

Although the present invention has been described in terms of specific exemplary embodiments, it will be appreciated that various modifications and alterations might be made by those skilled in the art without departing from the spirit and scope of the invention as set forth in the following claims.

What is claimed is:

1. A high speed processing flip-flop comprising:
   a header circuit having:
      a clock input to receive a clock signal for operation of said high speed processing flip-flop circuit;
      functional logic coupled to receive at least one functional input and said clock input, said functional logic configured to implement a logic processing function to generate an enable signal upon detection of an active clock input in accordance with said functional input;
      a pulse modulator coupled to receive said enable signal and to receive said clock input for generating clock pulses based on said enable signal; and
      a pulse flip-flop circuit including storage, a flip-flop output, at least one data input, and a clock pulse input for each data input, said pulse flip-flop circuit being configured to couple a data input to said flip-flop output and said storage during an active clock pulse for said corresponding data input such that said data input is not delayed by said logic processing in said functional logic.

2. The high speed processing flip-flop as set forth in claim 1, wherein said pulse modulator comprises a mock flip-flop circuit for generating clock pulses that track process and loading point operation of said pulse flip-flop circuit.

3. The high speed processing flip-flop as set forth in claim 2, wherein said mock flip-flop circuit comprises:
   feedback storage coupled to said clock input;
   an output stage coupled to said functional logic; and
   a pass gate coupling said output stage to a voltage source and being controlled by said clock pulse.

4. The high speed processing flip-flop as set forth in claim 1, wherein said functional logic comprises multiplexing logic for multiplexing at least two inputs for said pulse flip-flop circuit.

5. The high speed processing flip-flop as set forth in claim 4, wherein said multiplexing logic comprises scan circuitry for multiplexing a scan input and at least one data input in said pulse flip-flop circuit.

6. The high speed processing flip-flop as set forth in claim 1, wherein said functional logic comprises RS flip-flop logic.

7. The circuit as set forth in claim 1, wherein said functional logic comprises master/slave flip-flop logic.

8. The circuit as set forth in claim 1, wherein said pulse flip-flop circuit comprises:
   at least one input buffer coupled to receive a data input;
   a driver circuit for generating drive current for said pulse flip-flop output;
   feedback storage for storing a state in said pulse flip-flop;
   at least one pass transistor coupling said input buffer to said driver circuit and being controlled by said clock pulse such that an active clock pulse passes data to said feedback storage and said driver circuit.

9. A method for a processing data in a high speed flip-flop, said method comprising the steps of:

receiving a clock signal for timing operation of said high speed flip-flop in a clock signal path;

receiving at least one functional input in said clock signal path;

implementing a logic function in said clock signal path by generating an enable signal upon detection of an active clock input in accordance with said functional input;

generating at least one clock pulse based on said enable signal;

providing a storage for said high speed flip-flop; and coupling a data input to said high speed flip-flop to an output of said high speed flip-flop and said storage during an active clock pulse for said corresponding data input to generate a data path such that said data input is not delayed by said clock signal path.

10. The method as set forth in claim 9, wherein the step of generating clock pulses comprises the step of providing a mock flip-flop circuit for generating clock pulses that track process and loading point operations of said data path.

11. The method as set forth in claim 10, wherein the step of providing a mock flip-flop circuit comprises the steps of:

providing feedback storage;

coupling said feedback storage to said clock input;

coupling an output stage to said clock signal path; and coupling said output stage to a voltage source based on said clock pulse.

12. The method as set forth in claim 9, wherein the step of implementing a logic function in said clock signal path comprises the step of multiplexing at least two inputs for said high speed flip-flop circuit.

13. The method as set forth in claim 12, wherein the step of multiplexing at least two inputs comprises the step of multiplexing a scan input and at least one data input in said pulse flip-flop circuit.

14. The method as set forth in claim 9, wherein the step of implementing a logic function comprises the step of implementing a RS flip-flop logic function.

15. The method as set forth in claim 9, wherein the step of implementing a logic function comprises the step of implementing a master/slave flip-flop logic.

16. The method as set forth in claim 9, wherein the step of generating said clock pulses comprises the steps of:

providing at least one input buffer coupled to receive a data input;

generating drive current for an output of said clock signal path;

storing a state in a register; and coupling said input buffer to an output and being controlled by said clock pulse such that an active clock pulse passes data to said register and said output.

* * * * *